United States Patent
Fukazawa et al.

(10) Patent No.: US 9,812,319 B1
(45) Date of Patent: Nov. 7, 2017

(54) METHOD FOR FORMING FILM FILLED IN TRENCH WITHOUT SEAM OR VOID

(71) Applicant: ASM IP Holding B.V., Almere (NL)

(72) Inventors: Atsuki Fukazawa, Tama (JP); Hideaki Fukuda, Portland, OR (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/203,632

(22) Filed: Jul. 6, 2016

(51) Int. Cl.
  *H01L 21/31* (2006.01)
  *H01L 21/02* (2006.01)
  *C23C 16/455* (2006.01)

(52) U.S. Cl.
  CPC .... *H01L 21/0228* (2013.01); *C23C 16/45525* (2013.01); *H01L 21/0217* (2013.01); *H01L 21/02274* (2013.01); *H01L 21/02326* (2013.01); *H01L 21/02348* (2013.01)

(58) Field of Classification Search
  CPC ............. H01L 21/0228; H01L 21/0217; H01L 21/02274
  See application file for complete search history.

(56) References Cited

U.S. PATENT DOCUMENTS

| | | | | |
|---|---|---|---|---|
| 2004/0126990 A1* | 7/2004 | Ohta | ................ | H01L 21/76224 438/435 |
| 2006/0252228 A1* | 11/2006 | Jeng | ................ | H01L 21/76235 438/424 |
| 2014/0138779 A1* | 5/2014 | Xie | ................ | H01L 29/66545 257/401 |
| 2014/0273477 A1* | 9/2014 | Niskanen | ............ | H01L 21/0217 438/703 |
| 2015/0099342 A1* | 4/2015 | Tsai | ................ | H01L 21/76237 438/400 |
| 2015/0179501 A1* | 6/2015 | Jhaveri | ............ | H01L 21/76224 257/506 |

* cited by examiner

*Primary Examiner* — Bradley K Smith
(74) *Attorney, Agent, or Firm* — Snell & Wilmer LLP

(57) ABSTRACT

A method for forming a film filled in a trench of a substrate without seam or void includes: depositing a conformal SiN film in a trench of a substrate placed in a reaction space, using a halide compound as a precursor, until the trench is filled with the conformal SiN film serving as a filled film which has a seam and/or void; and then oxidizing the filled film without deposition of film to make the filled film expand until the seam and/or void of the filled film are/is diminished.

16 Claims, 4 Drawing Sheets

Fig. 5

| Parameter | Feed | Purge | RF | Purge |
|---|---|---|---|---|
| Si Precursor | ▓ | | | |
| Reactant | ▓ | ▓ | ▓ | ▓ |
| Carrier Gas | ▓ | ▓ | ▓ | ▓ |
| Dilution Gas | ▓ | ▓ | ▓ | ▓ |
| RF | | | ▓ | |

METHOD FOR FORMING FILM FILLED IN TRENCH WITHOUT SEAM OR VOID

BACKGROUND

Field of the Invention

The present invention generally relates to a method for forming a film filled in a trench of a semiconductor substrate without a seam and/or void.

Description of the Related Art

As film filling technology, a spin method applying a liquid and a flowable CVD method utilizing flowability of a film have been commonly used. These methods are excellent in terms of filling property since these methods use surface tension of a liquid. However, in some cases, a problem called "pattern-loading effect" occurs since the quantity of filled film varies depending on the dimensions of a pattern. Further, in these methods, after the film has filled in a trench, a process of hardening the filled film by annealing is required. In the annealing process, the filled film tends to shrink, causing the film to deform or collapse (when the film is used as a self-standing film) due to film shrinkage when the pattern has a size of nanometer order. In addition, deformation of film sometimes occurs when the filled film migrates to other grooves due to its surface tension after the film is filled in a trench, wherein migration of the film exerts stress on the pattern, causing deformation or destruction of the pattern.

Film filling technology using atomic layer deposition (ALD) which provides excellent step coverage is also available. However, since ALD deposits a conformal film uniformly on surfaces of a trench pattern, a seam on top of the trench and a void inside the trench are inevitably generated. Since a seam and/or void often cause a problem in fabrication of integrated circuits, new technology, which can resolve such a problem is needed.

Any discussion of problems and solutions in relation to the related art has been included in this disclosure solely for the purposes of providing a context for the present invention, and should not be taken as an admission that any or all of the discussion was known at the time the invention was made.

SUMMARY

In some embodiments, differently from the conventional methods of forming an embedding film by using the liquid form of film, a SiN film is deposited as an embedding film by atomic layer deposition (ALD) without using the liquid form of film, and despite the use of ALD, a film filled in a trench does not have a significant seam, e.g., a seam is significantly diminished as compared with an embedding film formed simply by ALD. Since a conformal film is deposited by ALD along sidewalls of a trench and on a bottom of the trench as well as on a top surface surrounding the trench, and fills the trench, a seam is mostly inevitably formed on a filled film near a center of the trench where the edges of conformal films meet. Also, a void is often inevitably formed in the filled film. In some embodiments, a SiN film filled in a trench is subjected to substitution reaction wherein Si—N bonds are replaced by Si—O bonds, causing expansion of the film so as to diminish a seam formed on the top of the filled film. In some embodiments, the degree of expansion of the film is controlled by using, as a precursor, a halogen-containing silane (e.g., monosilane, disilane, trisilane), a halogen-hydrocarbon-containing silane (e.g., monosilane, disilane, trisilane), a halogen-containing silylamine, or a halogen-hydrocarbon-containing silylamine. Preferably, a halide precursor containing hydrocarbon is used to inhibit over-expansion which causes deformation of a trench pattern. When a halide precursor containing hydrocarbon is used to form an embedding film, followed by oxidization to replace Si—N bonds by Si—O bonds, a part of the hydrocarbon present in the film is dissociated as impurities containing OH bonds during oxidization, decreasing expansion of the film by shrinkage of the film as a result of dissociation of the impurities. For example, when the precursor has no hydrocarbon, the film is expanded by 10% or more, whereas when the precursor has hydrocarbon, the film is expanded by less than 10%. The content of hydrocarbon in the precursor can control the degree of expansion of the film.

In some embodiments, after the film is expanded by oxidization, annealing in an inert gas atmosphere such as an atmosphere of nitrogen is conducted to remove impurities such as moisture which are included in the film during the oxidization process.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 5 shows a schematic process sequence of PEALD in one cycle for depositing a SiN film according to an embodiment of the present invention wherein a cell in gray represents an ON state whereas a cell in white represents an OFF state, and the width of each column does not represent duration of each process.

DETAILED DESCRIPTION OF EMBODIMENTS

Figure 1A:
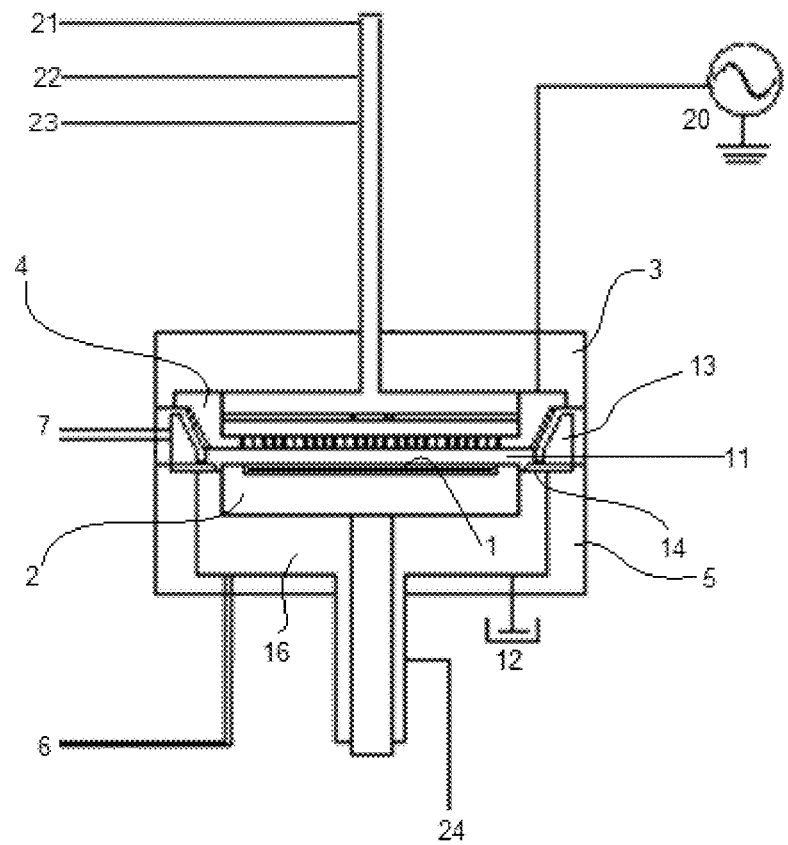
FIG. 1A is a schematic representation of a PEALD (plasma-enhanced atomic layer deposition) apparatus for depositing a film usable in an embodiment of the present invention.

In this disclosure, "gas" may include vaporized solid and/or liquid and may be constituted by a single gas or a mixture of gases, depending on the context. Likewise, an article "a" or "an" refers to a species or a genus including multiple species, depending on the context. In this disclosure, a process gas introduced to a reaction chamber through a showerhead may be comprised of, consist essentially of, or consist of a silicon-containing precursor and an additive gas. The additive gas includes a gas for oxidizing and/or nitriding the precursor when RF power is applied to the additive gas. The precursor and the additive gas can be introduced as a mixed gas or separately to a reaction space. The precursor can be introduced with a carrier gas such as a rare gas. A gas other than the process gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

The terms "constituted by" and "having" refer independently to "typically or broadly comprising", "comprising", "consisting essentially of", or "consisting of" in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

In the disclosure, "substantially zero" or the like may refer to an immaterial quantity, less than a detectable quantity, a quantity that does not materially affect the target or intended properties, or a quantity recognized by a skilled artisan as nearly zero, such that less than 10%, less than 5%, less than 1%, or any ranges thereof relative to the total or the referenced value in some embodiments.

In some embodiments, the term "precursor" refers generally to a compound that participates in the chemical reaction that produces another compound, and particularly to a compound that constitutes a film matrix or a main skeleton of a film, whereas the term "reactant" refers to a compound that activates a precursor, modifies a precursor, or catalyzes a reaction of a precursor.

In this disclosure, "containing a Si—N bond" may refer to being characterized by a Si—N bond or Si—N bonds, having a main skeleton substantially constituted by a Si—N bond or Si—N bonds, and/or having a substitutent substantially constituted by a Si—N bond or Si—N bonds. In this disclosure, "curing" refers to a process during which a chemical reaction (such as polymerization or crosslinking) and/or physical action (such as vaporization) take(s) place, resulting in a harder, tougher, and/or more stable linkage of film matrix. In this disclosure, "annealing" refers to a process during which a material is treated to get it into its stable form, e.g., a terminal group (such as an alcohol group and hydroxyl group) present in a component is replaced with a more stable group (such as a Si-Me group) and/or forms a more stable form (such as a Si—O bond). In this disclosure, the term "annealing" refers also to a process similar to curing, during which a substitution reaction takes place, e.g., a process of replacing Si—N bonds by Si—O bonds, resulting in expansion of a film. In some embodiments, the curing and the annealing are defined as mutually exclusive processes or alternatively are defined interchangeably.

The embodiments will be explained with respect to preferred embodiments. However, the present invention is not limited to the preferred embodiments.

In some embodiments, a method for forming a film filled in a trench of a substrate without seam or void, comprises: (i) depositing a conformal SiN film in a trench of a substrate placed in a reaction space, using a halide compound as a precursor; (ii) continuing step (i) until the trench is filled with the conformal SiN film serving as a filled film which has a seam and/or void; (iii) after step (ii), oxidizing the filled film without deposition of film to make the filled film expand; and (iv) continuing step (iii) until the seam and/or void of the filled film are/is diminished.

In this disclosure, the term "seam" refers to a groove-like recess or depression formed by the abutment of edges formed in a filled film, and the "seam" can be confirmed using a scanning transmission electron microscopy (STEM) or transmission electron microscopy (TEM) wherein if observation reveals a clear longitudinal line in an area of a filled film, a "seam" is "present", and if a photograph reveals a recognizable longitudinal line in an area of a filled film, a "seam" is "slightly present".

In this disclosure, the term "void" refers to a generally closed vacant space (e.g., having an elliptical shape) formed in a filled film, and the "void" can be confirmed using a vertical cross section of a filled film in a manner similar to that for confirming the "seam".

In this disclosure, the term "expansion" of a filled film refers to an increase in volume of a filled film when an oxidization process is complete as compared with a volume of the filled film before the oxidization process, and the "expansion" can be determined based on a change in thickness of the filled film measured with a film thickness gauge.

In this disclosure, the filled film or fillable film is referred to also as an embedding film.

In some embodiments, the oxidizing process in steps (iii) and (iv) is a process of replacing Si—N bonds by Si—O bonds (e.g., Si—NH+$H_2O$⇒ Si—O+$NH_3$↑). By replacing Si—N bonds by Si—O bonds, the number of atoms constituting the film increases since oxygen has a higher number of atoms than nitrogen, resulting in expansion of the film. In some embodiments, by the substitution reaction, the SiN film can be converted to a film constituted substantially by SiOH, e.g., the film shows characteristics of silicon oxide film, rather than silicon nitride film. For example, the conversion of the silicon nitride film to the silicon oxide film can be confirmed based on a change of its refractive index (RI). The refractive index of a silicon nitride film is approximately 1.85 measured at a frequency of 633 nm, and the refractive index of a silicon oxide film is approximately 1.47 to 1.5 measured at a frequency of 633 nm. Thus, if the refractive index of the film is changed from approximately 1.85 to approximately 1.47 to 1.5, then it can be confirmed that the film has been converted from the one constituted by SiN to the other constituted by SiO.

In some embodiments, step (iv) continues until an expansion rate of the filled film is in a range of 5% to 20%, preferably 15% or less (e.g., 5% to 10%). If the expansion rate of the film is too high, a trench pattern may be deformed, causing a problem. If the expansion rate of the film is too low, a seam/void may not sufficiently be diminished.

In some embodiments, the oxidizing process in steps (iii) and (iv) is conducted by annealing the filled film in an atmosphere of $H_2O$ or $H_2O_2$ (e.g., Si—NH+$H_2O$⇒ Si—O+$NH_3$), curing the filled film by UV irradiation, heating the filled film using an oxidizing gas (e.g., Si—NH+$O_2$⇒ Si—O+NH↑), or conducting any of the foregoing in combination. Preferably, the oxidizing process comprises annealing the filled film in an atmosphere of $H_2O$ or $H_2O_2$.

In some embodiments, the deposition process in steps (i) and (ii) is a process of atomic layer deposition (ALD). In some embodiments, the process of ALD is a process of plasma-enhanced ALD (PEALD). In order to form an embedding film (filled film) without a seam/void, the film deposited in a trench should have a high conformality, e.g., 90% or higher. If the conformality of the film is low, a seam/void will be too great to be diminished.

In some embodiments, the precursor contains silicon, halogen, and hydrocarbon in its molecule. When the precursor contains a hydrocarbon component, the resultant SiN film also contains a hydrocarbon component. The hydrocarbon component such as $CH_3$ reacts with OH which is generated during the oxidization process, and forms alcohol such as $CH_3OH$ which evaporates during the oxidization process, causing contraction of the film. In some embodiments, the precursor is selected from the group consisting of $SiH_2X_2$, $SiHX_2Y$, $Si_2X_6$, $Si_3X_8$, $Si_2X_4Y_2$, $SiX_2Y_4$, $Si_3X_2Y_4$, $Si_3X_4Y_2$, $Si_3NH_8X$, and $Si_3NH_6X_3$ wherein X is a halogen, and Y is a hydrocarbon. In some embodiments, the process of ALD uses a reactant gas which is selected from the group consisting of $N_2$, $N_2/H_2$, $N_xH_y$, and $N_xH_yC_z$ wherein x, y, and z are integers.

In some embodiments, the method further comprises, after step (iv), (v) annealing the filled film in an atmosphere of inert gas. By the inert gas annealing, moisture which is generated during the oxidization process can be removed from the film. Although the film may possibly be slightly shrunk when removing moisture from the film during the inert gas annealing, the degree of shrinkage of the film is not high enough to create a new void and/or seam. Additionally, during the inert gas annealing, hydrocarbon components remaining in the film may also be removed. In some embodiments, the inert gas is typically nitrogen gas. However, other inactive gas such as $H_2$ and a noble gas (e.g., Ar) can be used as the inert gas. In some embodiments, step (v) continues until substantially no O—H bonds in the filled film are detected.

In some embodiments, the trench has a width of 50 nm or less and an aspect ratio of 2 to 5. If the width of the trench is too wide and/or the aspect ratio is too high, it will be difficult to form an embedding film without a seam/void. The thickness of a SiN film deposited in the trench is typically approximately a half of the width of the trench (e.g., 45% to 50% of the width of the trench), provided that the conformality of the film is 90% to 100%.

Some embodiments will be explained with respect to the drawings. However, the present invention is not limited to the embodiments.

Figure 4:
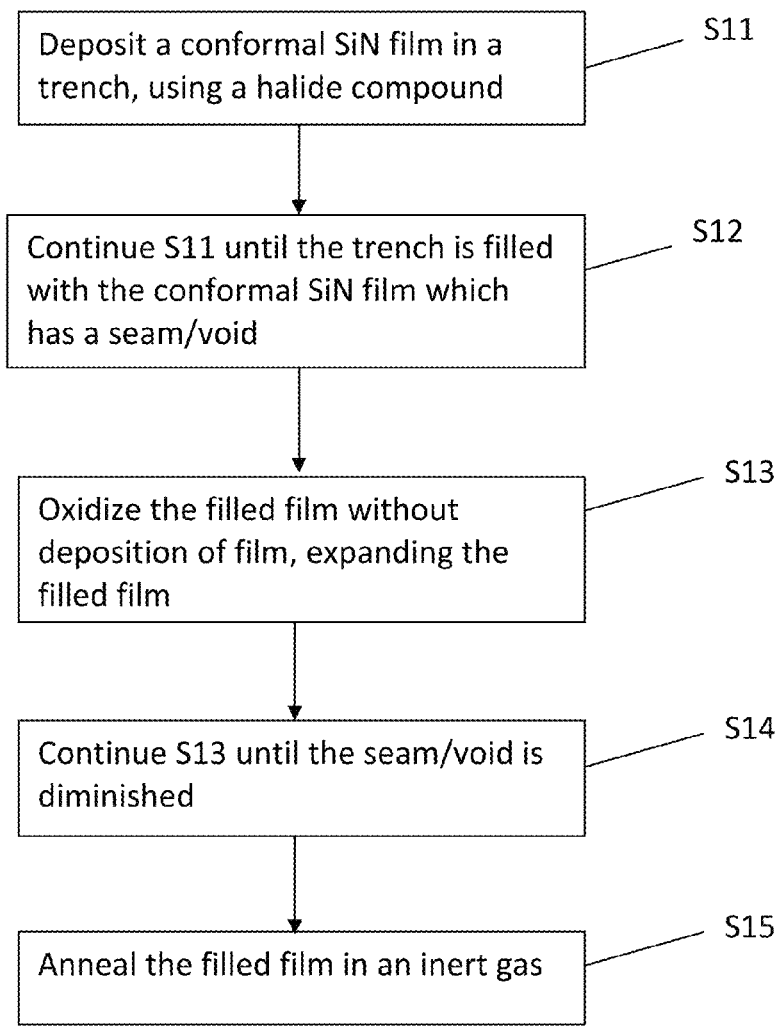
FIG. 4 is a flow chart of forming a filled film in a trench according to an embodiment of the present invention.

FIG. 4 is a flow chart of forming a filled film in a trench according to an embodiment of the present invention. In this chart, in a method for forming a film filled in a trench of a substrate without seam or void, first, a conformal SiN film is deposited in a trench of a substrate placed in a reaction space, using a halide compound as a precursor (S11). Step S11 continues until the trench is filled with the conformal SiN film serving as a filled film which has a seam and/or void (S12). After step S12, the filled film is oxidized without deposition of film to make the filled film expand (S13). Step S13 continues until the seam and/or void of the filled film are/is diminished (S14). After step S14, the filled film is annealed in an atmosphere of inert gas (S15).

Figure 2:
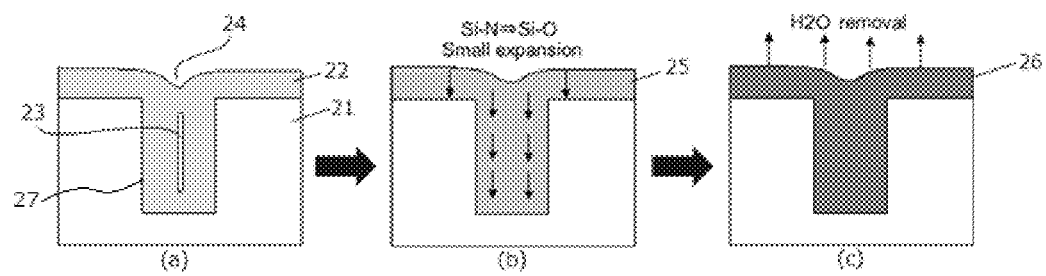
FIG. 2 illustrates schematic cross sections of a partially fabricated integrated circuit, showing film-filling processes (a), (b), and (c) in a trench according to an embodiment of the present invention.

FIG. 2 illustrates schematic cross sections of a partially fabricated integrated circuit, showing film-filling process (a) corresponding to steps S11 and S12, film-filling process (b) corresponding to steps S13 and S14, and film-filling process (c) corresponding to step S15 in a trench according to an embodiment of the present invention. In process (a), a SiN film 22 is deposited in a trench 27 of a substrate 21. The SiN film has a void 23 and a seam 24. In process (b), the SiN film is oxidized to replace Si—N bonds by Si—O bonds, and as a result, the SiN film is converted to a SiN film 25 and expands. Due to the expansion, the expanded SiO film 25 has substantially no void, and the seam is significantly diminished (in some embodiments, the seam can substantially disappear or be unidentifiable). In process (c), the expanded SiO film is annealed in inert gas to remove moisture, thereby forming a dehydrated SiO film 26.

FIG. 5 shows a schematic process sequence of PEALD in one cycle for depositing a SiN film according to an embodiment of the present invention wherein a cell in gray represents an ON state whereas a cell in white represents an OFF state, and the width of each column does not represent duration of each process. In this embodiment, one cycle of PEALD comprises "Feed" where a Si-containing precursor gas (Si-precursor) is fed to a reaction space via a carrier gas which carries the Si-precursor without applying RF power to the reaction space, and also, a dilution gas and a reactant gas are fed to the reaction space, thereby chemisorbing the etching gas onto a surface of a substrate via self-limiting adsorption; "Purge" where no Si-precursor is fed to the reaction space, while the carrier gas, the dilution gas, and reactant gas are continuously fed to the reaction space, without applying RF power, thereby removing non-chemisorbed gas and excess gas from the surface of the substrate; "RF" where RF power is applied to the reaction space while the carrier gas, the dilution gas, and reactant gas are continuously fed to the reaction space, without feeding the Si-precursor, thereby depositing a dielectric layer through plasma surface reaction with the reactant gas in an excited state; and "Purge" where the carrier gas, the dilution gas, and reactant gas are continuously fed to the reaction space, without feeding the Si-precursor and without applying RF power to the reaction space, thereby removing by-products and excess gas from the surface of the substrate. The carrier gas can be constituted by the reactant gas. Due to the continuous flow of the carrier gas entering into the reaction space as a constant stream into which the Si-precursor is injected intermittently or in pulses, purging can be conducted efficiently to remove excess gas and by-products quickly from the surface of the layer, thereby efficiently continuing multiple ALD cycles.

In the above process sequence, the precursor is supplied in a pulse using a carrier gas which is continuously supplied. This can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor gas in pulses by switching the main line and the detour line. FIG. 1B illustrates a precursor supply system using a flow-pass system (FPS) according to an embodiment of the present invention (black valves indicate that the valves are closed). As shown in (a) in FIG. 1B, when feeding a precursor to a reaction chamber (not shown), first, a carrier gas such as Ar (or He) flows through a gas line with valves b and c, and then enters a bottle (reservoir) 20. The carrier gas flows out from the bottle 20 while carrying a precursor gas in an amount corresponding to a vapor pressure inside the bottle 20, and flows through a gas line with valves f and e, and is then fed to the reaction chamber together with the precursor. In the above, valves a and d are closed. When feeding only the carrier gas (noble gas) to the reaction chamber, as shown in (b) in FIG. 1B, the carrier gas flows through the gas line with the valve a while bypassing the bottle 20. In the above, valves b, c, d, e, and f are closed.

The precursor may be provided with the aid of a carrier gas. Since ALD is a self-limiting adsorption reaction process, the number of deposited precursor molecules is determined by the number of reactive surface sites and is independent of precursor exposure after saturation, and a supply of the precursor is such that the reactive surface sites are saturated thereby per cycle. A plasma for deposition may be generated in situ, for example, in an ammonia gas that flows continuously throughout the deposition cycle. In other embodiments the plasma may be generated remotely and provided to the reaction chamber.

As mentioned above, each pulse or phase of each deposition cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface.

Figure 1B:
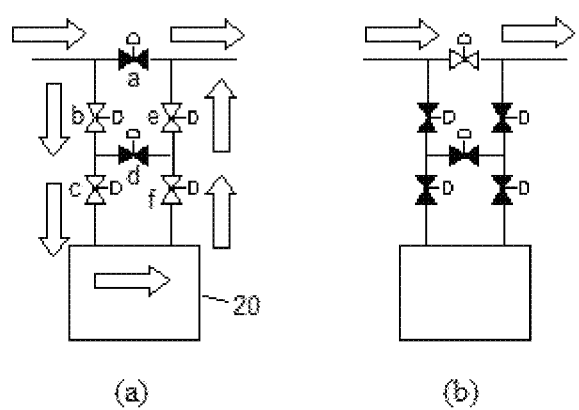
FIG. 1B illustrates a schematic representation of a precursor supply system using a flow-pass system (FPS) usable in an embodiment of the present invention, where (a) indicates a carrier gas carrying a precursor, and (b) indicates a carrier gas without carrying a precursor.

The process cycle can be performed using any suitable apparatus including an apparatus illustrated in FIG. 1A, for example. FIG. 1A is a schematic view of a PEALD apparatus, desirably in conjunction with controls programmed to conduct the sequences described below, usable in some embodiments of the present invention. In this figure, by providing a pair of electrically conductive flat-plate electrodes 4, 2 in parallel and facing each other in the interior 11 (reaction zone) of a reaction chamber 3, applying HRF power (13.56 MHz or 27 MHz) 20 to one side, and electrically grounding the other side 12, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reactant gas (and noble gas) and precursor gas are introduced into the reaction chamber 3 through a gas line 21 and a gas line 22, respectively, and through the shower plate 4. Additionally, in the reaction chamber 3, a circular duct 13 with an exhaust line 7 is provided, through which gas in the interior 11 of the reaction chamber 3 is exhausted. Additionally, a dilution gas is introduced into the reaction chamber 3 through a gas line 23. Further, a transfer chamber 5 disposed below the reaction chamber 3 is provided with a seal gas line 24 to introduce seal gas into the interior 11 of the reaction chamber 3 via the interior 16 (transfer zone) of the transfer chamber 5 wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition of multi-element film and surface treatment are performed in the same reaction space, so that all the steps can continuously be conducted without exposing the substrate to air or other oxygen-containing atmosphere. In some embodiments, a remote plasma unit can be used for exciting a gas.

In some embodiments, in the apparatus depicted in FIG. 1A, the system of switching flow of an inactive gas and flow of a precursor gas illustrated in FIG. 1B (described earlier) can be used to introduce the precursor gas in pulses without substantially fluctuating pressure of the reaction chamber.

In some embodiments, PEALD may be conducted under conditions shown in Table 1 below.

TABLE 1

(numbers are approximate)
Conditions for Deposition Cycle

| | |
|---|---|
| Substrate temperature | 200 to 700° C. (preferably 300 to 500° C.) |
| Pressure | 100 to 5000 Pa (preferably 200 to 1000 Pa) |
| Precursor pulse | 0.1 to 5 sec (preferably 0.1 to 1 sec) |
| Precursor purge | 0.1 to 10 sec (preferably 0.5 to 5 sec) |
| Flow rate of reactant (continuous) | 100 to 10000 sccm (preferably 100 to 5000 sccm) for $N_2$; 50 to 3000 sccm (preferably 100 to 2000 sccm) for $H_2$, (N2/H2=100-10000/50-3000, preferably 100-5000/100-2000) 500 to 10000 sccm (preferably 1000 to 5000 sccm) for $NH_3$ |
| Flow rate of carrier gas (continuous) | 500 to 5000 sccm (preferably 1000 to 4000 sccm) |
| Flow rate of dilution gas (continuous) | 1000 to 5000 sccm (preferably 1000 to 3000 sccm) |
| RF power (13.56 MHz) for a 300-mm wafer | More than 600 W (preferably 600 to 1000 W)* |
| RF power pulse | 1 to 10 sec (preferably 3 to 5 sec) |
| Purge | 0.1 to 5 sec (preferably 0.1 to 1 sec) |
| Growth rate per cycle (on top surface) | 0.01 to 0.03 nm/cycle |
| Step coverage (side/top; side/bottom) | 90 to 105%; 90 to 95% (preferably, 90 to 95%; 90 to 93%) |

*) Approximately 0.85 to 1.41 $W/cm^2$ (600 to 1000 W for 300-mm wafer) can be applied to a different size of substrate such as a 200-mm substrate and a 450-mm substrate; likewise, "W" can be converted to "W/cm$^2$" in this disclosure.

In some embodiments, a SiN film can be deposited by thermal ALD under conditions shown in Table 2 below.

TABLE 2

(numbers are approximate)
Conditions for Deposition Cycle

| | |
|---|---|
| Substrate temperature | 200 to 700° C. (preferably 300 to 500° C.) |
| Pressure | 100 to 5000 Pa (preferably 200 to 1000 Pa) |
| Precursor pulse | 1 to 120 sec (preferably 1 to 60 sec) |
| Precursor purge | 1 to 120 sec (preferably 1 to 30 sec) |
| Flow rate of reactant (continuous) | 100 to 10000 sccm (preferably 100 to 5000 sccm) for N$_2$; 50 to 3000 sccm (preferably 100 to 2000 sccm) for H$_2$; (N2/H2=100-10000/50-3000, preferably 100-5000/100-2000) 500 to 10000 sccm (preferably 1000 to 5000 sccm) for NH$_3$ |
| Flow rate of carrier gas (continuous) | 500 to 5000 sccm (preferably 1000 to 4000 sccm) |
| Flow rate of dilution gas (continuous) | 1000 to 5000 sccm (preferably 1000 to 3000 sccm) |
| Purge | 0.1 to 60 sec (preferably 1 to 30 sec) |
| Growth rate per cycle (on top surface) | 0.01 to 0.03 nm/cycle |
| Step coverage (side/top; side/bottom) | 90 to 105%; 90 to 95% (preferably, 90 to 95%; 90 to 93%) |

In some embodiments, an oxidizing process can be conducted by H$_2$O annealing under conditions shown in Table 3 below.

TABLE 3

(numbers are approximate)
Conditions for H$_2$O annealing

| | |
|---|---|
| Duration | 10 to 90 min (preferably 20 to 60 min) |
| Pressure | 200 to 3000 Pa (preferably 300 to 1000 Pa) |
| Temperature | 200 to 700° C. (preferably 300 to 400° C.) |
| H2O partial pressure | 20% 0.1 slm/min |
| Other gas (flow rate?) | Ar:2slm |

In some embodiments, an oxidizing process can be conducted by UV cure under conditions shown in Table 4 below.

TABLE 4

(numbers are approximate)
Conditions for UV cure

| | |
|---|---|
| Duration | 30 to 300 sec (preferably 30 to 120 sec) |
| Pressure | 100 to 1000 Pa (preferably 200 to 500 Pa) |
| Temperature | 100 to 700° C. (preferably 200 to 400° C.) |
| UV illumination intensity | 200 to 10000 mW (preferably 1000 to 5000 mW) |
| Usable gas | O2 |
| Flow rate | 500 to 10000 sccm (preferably 1000 to 5000 sccm) |

In some embodiments, an oxidizing process can be conducted by heat treatment using an oxidizing gas under conditions shown in Table 5 below.

TABLE 5

(numbers are approximate)
Conditions for heat treatment with oxidizing gas

| | |
|---|---|
| Duration | 10 to 120 min (preferably 30 to 60 min) |
| Pressure | 1000 to Atmosphere Pa (preferably 5000 to AtomspherePa) |

TABLE 5-continued (numbers are approximate)
Conditions for heat treatment with oxidizing gas

| | |
|---|---|
| Temperature | 200 to 700° C. (preferably 200 to 400° C.) |
| Oxidizing gas | O2, O3 |
| Flow rate | 100 to 5000 sccm (preferably 500 to 2000 sccm) |
| Other gas | Ar |
| Flow rate | 500 to 3000 sccm (preferably 1000 to 2000 sccm) |

In some embodiments, an inert gas annealing can be conducted under conditions shown in Table 6 below.

TABLE 6

(numbers are approximate)
Conditions for H2O annealing

| | |
|---|---|
| Duration | 10 to 90 min (preferably 30 to 60 min) |
| Pressure | Atomsphere |
| Temperature | 100 to 700° C. (preferably 200 to 500° C.) |
| N2 flow rate | 1000 to 10000 sccm (preferably 2000 to 5000 sccm) |

In some embodiments, a dual chamber reactor (two sections or compartments for processing wafers disposed close to each other) can be used, wherein a reactant gas and a noble gas can be supplied through a shared line whereas a precursor gas is supplied through unshared lines.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

Example 1

A SiN film was formed on a 300-mm substrate having a patterned surface having an opening width of about 30 nm, a depth of 105 nm, and an aspect ratio of about 3.5 (an interval of trenches was 130 nm) under the conditions shown in Table 7 (common conditions) and Table 8 (conditions specific to each example) below using the sequence illustrated in FIG. 2 under the conditions shown in Table 9 below and the PEALD apparatus illustrated in FIGS. 1A and 1B. The thickness of film was approximately 15 nm.

TABLE 7

(numbers are approximate)
Common conditions

| Parameter | PEALD | H$_2$O/H$_2$O$_2$ anneal |
|---|---|---|
| Temp (° C.) | 400 | See Table 8 |
| Pressure (Pa) | 400 | 800 |
| Carrier Ar (slm) | 2 | NA |

TABLE 7-continued (numbers are approximate)
Common conditions

| Parameter | PEALD | $H_2O/H_2O_2$ anneal |
|---|---|---|
| Dilution Ar (slm) | 1 | NA |
| Ambient Ar (slm) | NA | 2 |
| $H_2O$ vapor (slm/min) | NA | 0.1 |
| Duration (min) | See Table 8 | 30 |

TABLE 8

(numbers are approximate)

| | SiN deposition | | | $H_2O/H_2O_2$ anneal | | |
|---|---|---|---|---|---|---|
| Ex. | SiN precursor | Reactant (slm) | RF (W) | $H_2O_2$ 250° C. | $H_2O$ 300° C. | $H_2O$ 700° C. |
| Com. 1 | Diiodosilane | $H_2/N_2$ (0.3/0.5) | 220 | — | — | — |
| Com. 2 | Dichlorotetra-mehtyldisilane | $NH_3$ (2) | 100 | — | — | — |
| Ex. 1 | Diiodosilane | $H_2/N_2$ (0.3/0.5) | 220 | ∘ | — | — |
| Ex. 2 | Diiodosilane | $H_2/N_2$ (0.3/0.5) | 220 | — | ∘ | — |
| Ex. 3 | Diiodosilane | $H_2/N_2$ (0.3/0.5) | 220 | — | — | ∘ |
| Ex. 4 | Dichlorotetra-mehtyldisilane | $NH_3$ (2) | 100 | ∘ | — | — |
| Ex. 5 | Dichlorotetra-mehtyldisilane | $NH_3$ (2) | 100 | — | ∘ | — |
| Ex. 6 | Monochloro-trissilylmehtyl-amine | $NH_3$ (2) | 100 | ∘ | — | — |
| Ex. 7 | Monochloro-trissilylmehtyl-amine | $NH_3$ (2) | 100 | — | ∘ | — |

TABLE 9

(numbers are approximate)

| | Diiodosilane | Dichlorotetra-mehtyldisilane | Monochloro-trissilylmehtylamine |
|---|---|---|---|
| Feed (sec) | 0.1 | 1 | 0.1 |
| Purge (sec) | 1 | 1 | 1 |
| RF (sec) | 5 | 5 | 3 |
| Purge (sec) | 0.1 | 0.1 | 0.1 |

Each filled film in the trench was evaluated as follows:

Seam upon SiN deposition: Using a scanning transmission electron microscopy (STEM), if observation revealed a clear longitudinal line in an area of the filled film, a "seam" was "present", if a photograph revealed a recognizable longitudinal line in an area of the filled film, a "seam" was "slightly present", and if a photograph revealed no recognizable longitudinal line in an area of the filled film, a "seam" was "not present".

Seam upon $H_2O/H_2O_2$ annealing: Evaluated in the same manner as above.

Expansion rate (%) upon $H_2O/H_2O_2$ annealing: The expansion rate was determined based on a change in thickness of the filled film measured before and after the $H_2O/H_2O_2$ annealing with a film thickness gauge.

Deformation/damage upon $H_2O/H_2O_2$ annealing: when observing a STEM photograph of a cross section of the filled trench, if the underlying film (core material) was deformed (e.g., the core material between adjacent trenches was inclined) to the extent that the width of the opening of the trench was changed by 10% or more, deformation/damage was "present", and if not, deformation/damage was "not present", Refractive index (RI): The refractive index (RI) of the filled film was measured at a frequency of 633 nm. If the RI was approximately 1.85, the film was determined as SiN film, and if the RI was approximately 1.47 to 1.50, the film was determined as SiO film.

The results are shown in Table 10 below.

TABLE 10

(numbers are approximate)

| Ex | Seam upon SiN deposition | Seam upon $H_2O/H_2O_2$ anneal | Expansion rate upon $H_2O/H_2O_2$ anneal (%) | Deformation/damage upon $H_2O/H_2O_2$ anneal | RI @ 633 nm |
|---|---|---|---|---|---|
| Com. 1 | Present | — | — | — | 1.86 |
| Com. 2 | Present | — | — | — | 1.84 |
| Ex. 1 | Slightly present | Not present | 11 | Not present | 1.49 |
| Ex. 2 | Slightly present | Not present | 13 | Not present | 1.47 |
| Ex. 3 | Slightly present | Not present | 13 | Not present | 1.47 |
| Ex. 4 | Slightly present | Not present | 5 | Not present | 1.50 |
| Ex. 5 | Slightly present | Not present | 6 | Not present | 1.50 |
| Ex. 6 | Slightly present | Not present | 12 | Not present | 1.48 |
| Ex. 7 | Slightly present | Not present | 14 | Not present | 1.47 |

As shown in Table 10, in all of the examples, by the $H_2O/H_2O_2$ annealing, the SiN film was successfully converted to the SiO film, and the seam was effectively diminished without causing deformation/damage to the core material.

Example 2

The filled film according to Example 1 and 2 above was subjected to $N_2$ annealing to remove moisture from the film under the conditions shown in Table 11 below.

TABLE 11

(numbers are approximate)

| Parameter | $N_2$ anneal |
|---|---|
| Temp (° C.) | 900 |
| $N_2$ (slm) | 5 |
| Pressure (kPa) | 100 |
| Duration (min) | 30 |

Figure 3:
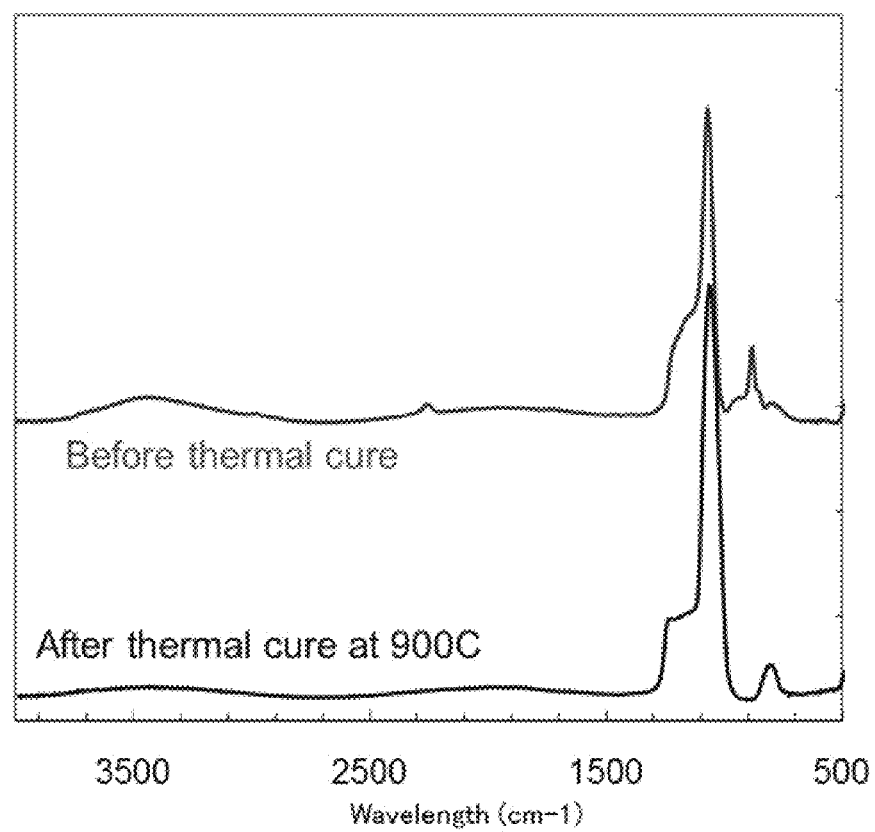
FIG. 3 is a Fourier Transform Infrared (FTIR) spectrum of a silicon nitride filled film according to an embodiment of the present invention.

FIG. 3 is a Fourier Transform Infrared (FTIR) spectrum of the silicon nitride filled film. As shown in FIG. 3, by the $N_2$ annealing, substantially all moisture present in the filled film was removed therefrom. Further, FIG. 3 also confirms that the film was constituted by SiO, and by the $N_2$ annealing, other impurities such as Si—H bonds slightly remaining in the filled film were also dissociated.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a film filled in a trench of a substrate without seam or void, comprising:
   (i) depositing a conformal SiN film as a layer in a trench of a substrate placed in a reaction space, using a halide compound as a precursor;
   (ii) repeating step (i) until the trench is filled with accumulated layers of the conformal SiN film and a top opening of the trench is closed by the accumulated layers, which accumulated layers form a filled film which has a seam and/or void, said filled film referring to a filler filling the trench and formed of the accumulated layers, said seam referring to a longitudinal line observed on a cross section of the filler, said void referring to a closed vacant space observed on a cross section of the filler;
   (iii) after step (ii), oxidizing the filled film without deposition of film to make the filled film expand; and
   (iv) continuing step (iii) until the seam and/or void of the filled film are/is diminished.

2. The method according to claim 1, wherein the oxidizing process in steps (iii) and (iv) is conducted by annealing the filled film in an atmosphere of $H_2O$ or $H_2O_2$, curing the filled film by UV irradiation, heating the filled film using an oxidizing gas, or conducting any of the foregoing in combination.

3. The method according to claim 2, wherein the oxidizing process comprises annealing the filled film in an atmosphere of $H_2O$ or $H_2O_2$.

4. The method according to claim 1, wherein the oxidizing process in steps (iii) and (iv) is a process of replacing Si—N bonds by Si—O bonds.

5. The method according to claim 1, wherein step (iv) continues until an expansion ratio of the filled film is in a range of 5% to 20%, said expansion ratio referring to an increase in percentage in volume of the filled film when step (iii) is complete as compared with a volume of the filled film before step (iii).

6. The method according to claim 1, wherein step (iv) continues until the SiN film is converted to a film constituted substantially by SiOH.

7. The method according to claim 1, wherein the deposition process in steps (i) and (ii) is a process of atomic layer deposition (ALD).

8. The method according to claim 7, wherein the process of ALD is a process of plasma-enhanced ALD (PEALD).

9. The method according to claim 7, wherein the precursor contains silicon, halogen, and hydrocarbon in its molecule.

10. The method according to claim 7, wherein the precursor is selected from the group consisting of $SiH_2X_2$, $SiHX_2Y$, $Si_2X_6$, $Si_3X_8$, $Si_2X_4Y_2$, $SiX_2Y_4$, $Si_3X_2Y_4$, $Si_3X_4Y_2$, $Si_3NH_8X$, and $Si_3NH_6X_3$ wherein X is a halogen, and Y is a hydrocarbon.

11. The method according to claim 7, wherein the process of ALD uses a reactant gas which is selected from the group consisting of $N_2$, $N_2/H_2$, $N_xH_y$, and $N_xH_yC_z$ wherein x, y, and z are integers.

12. The method according to claim 1, wherein the conformality of the conformal SiN film in the trench is 90% or higher.

13. The method according to claim 1, further comprising, after step (iv), (v) annealing the filled film in an atmosphere of inert gas.

14. The method according to claim 13, wherein the inert gas is nitrogen gas.

15. The method according to claim 13, wherein when step (v) is complete, the annealed filled film has substantially no O—H bonds.

16. The method according to claim 1, wherein the trench has a width of 50 nm or less but at least about 30 nm and an aspect ratio of 2 to 5.

* * * * *